Jan. 8, 1957 J. COHEN 2,777,101

JUNCTION TRANSISTOR

Filed Aug. 1, 1955

INVENTOR.
JERROLD COHEN
BY Harry M. Saragovitz
ATTORNEY

United States Patent Office 2,777,101
Patented Jan. 8, 1957

2,777,101

JUNCTION TRANSISTOR

Jerrold Cohen, Asbury Park, N. J., assignor to the United States of America as represented by the Secretary of the Army Application August 1, 1955, Serial No. 525,824

7 Claims. (Cl. 317—235)

(Granted under Title 35, U. S. Code (1952), sec. 266)

The invention described herein may be manufactured and used by or for the Government for governmental purposes, without the payment of any royalty thereon.

This invention relates to a junction transistor for use as a circuit element in the translation and control of electrical signal and, more particularly, to an improved junction transistor for use in the high frequency region.

It is an object of the invention to provide an improved transistor having a relatively high frequency range and a relatively high power handling capacity.

It is a further object of the invention to provide an improved transistor having the advantages of the PNIP transistor in addition to having reduced emitter-base capacitance.

It is still a further object of the invention to provide an improved transistor having all the advantages of the PNIP transistor in addition to having a higher range of operating frequencies.

In U. S. Patent No. 2,569,347, issued to W. Shockley on September 25, 1951, there is disclosed a semi-conductor device having a middle layer which may be of either of two conductivity types, N or P, and having adjacent layers of the opposite conductivity types on both sides thereof to form respectively a PNP or NPN transistor. Electrical connections are made to the three layers. The connection to the middle layer is called the base, and the connections to the two outer layers are called respectively the emitter and the collector. An electrical input signal may be applied between the emitter and base and an electrical output may be derived from a circuit connected between the base and the collector for either type of transistor. As compared to the PNP transistor the polarities and direction of current flow in the NPN transistor are reversed.

For applications in the high frequency region semi-conductor triodes or transistors of the PNP or NPN type have disadvantages and limitations. Modifications of semi-semi-conductor triodes for use in the high frequency region have been made involving design changes. These changes involved the conflicting requirements of inter-electrode capacitance and power capabilities and resulted in a compromised construction. Eventually the modified triodes proved to be unsatisfactory and a new structure, the PNIP or NPIN transistor, was evolved. It is well known in the art that for junction transistors the transistor formed by the interchange of N and P zones closely retains the operating qualities of the original transistor. Therefore, in the description which follows, it should be understood that in all cases P and N layers may be substituted one for the other.

Figures 1, 3, 4:
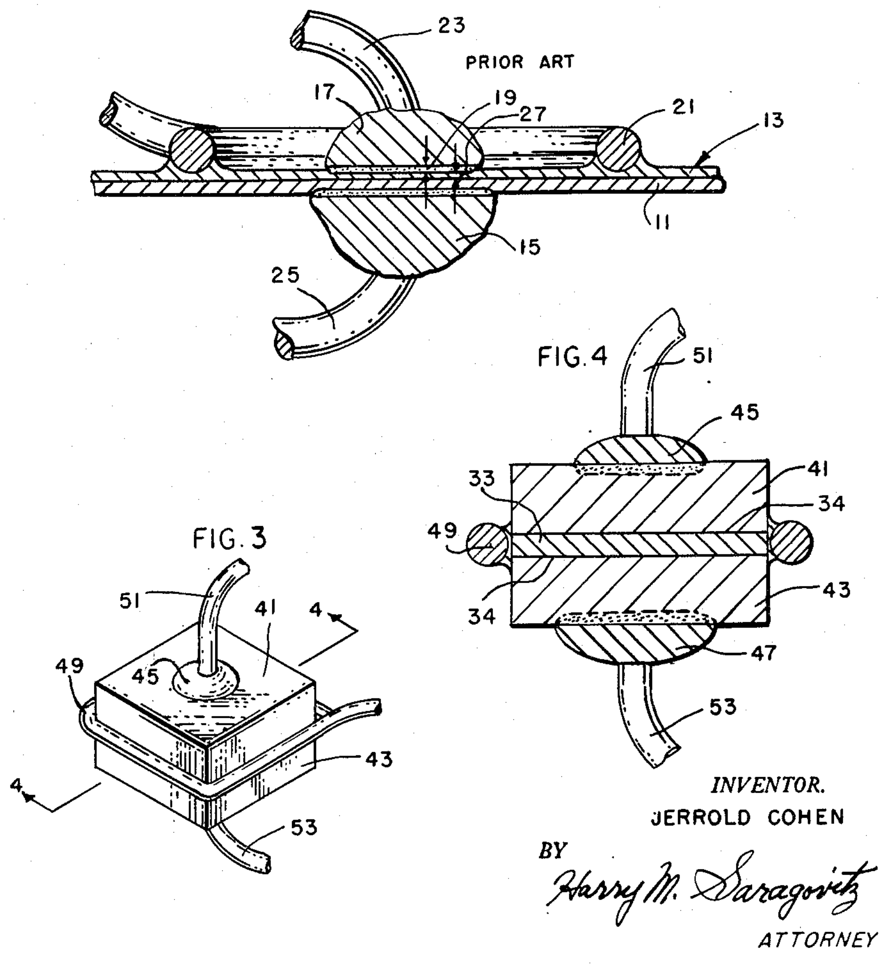
Fig. 1 is a sectional view of a high frequency transistor of the type known in the prior art.
Fig. 3 is a perspective view of the improved transistor.
Fig. 4 is a cross-sectional view of the improved transistor taken along the line 4—4 of Fig. 3.

Referring to Fig. 1, a prior art PNIP transistor is shown which has a pure or intrinsic type layer 11 placed between an N-type base 13 and a P-type collector 15. There is also a P-type emitter 17 affixed to the base 13. The fabrication of the PNIP transistor involves the production of 2 mil thick wafers of intrinsic germanium 11 with a skin or surface layer of 0.1 to 1.0 ohm-cm./N-type germanium 13 (0.3 to 0.5 mil thick). Subsequently, P-type collector 15 and P-type emitter 17 electrodes are alloyed onto this intrinsic wafer 11 having an N-type skin 13 by an indium germanium fusing process. The variables time, temperature and amount of indium may be controlled in a known manner to give the required alloying depth. The depth to which the emitter alloy fuses into N-type base, i. e., the emitter alloying thickness indicated at 19, cannot be precisely predetermined. A base terminal in the shape of a ring called a ring-base terminal 21, an emitter lead 23, and a collector lead 25 are then applied by soldering techniques.

The PNIP transistor is more fully described in an article by J. M. Early in the May 1954 issue of the Bell System Telephone Journal. This PNIP transistor has a much higher operating frequency range and a greater power handling capacity in this high frequency range than previous junction semiconductor triodes. This is achieved primarily through low collector-base capacitance, and low ohmic base resistance.

In the PNIP transistor the voltage drop across the PIN junction occurs almost completely in the intrinsic or I layer. Since this I layer is comparatively narrow the electric field in this layer is very high and electrons and holes are swept from this layer by the electric field. The result, an I layer depleted of electrons and holes, is called a depletion layer.

The depletion layer of the collector-base junction is thinner in the PNP transistor than in the PNIP transistor. In the PNP transistor the depletion layer of the collector-base or PN junction, depends on the resistivity of both the N and P layers. If a given layer has a high resistivity the depletion layer extends relatively far into the given layer. However both the P and N layers have relatively low resistivity; and therefore the depletion layer of the PN junction extends only a short distance into either the P or N layers. Therefore in the PNIP transistor the depletion layer, i. e., the intermediate I layer of the collector-base or PIN junction is much thicker than in the PNP transistor.

Junction capacitance varies inversely and reverse breakdown voltage varies directly with the width of the junction depletion layer. Therefore, in the PNIP transistor the additional feature of an intermediate intrinsic layer acting as a relatively thick depletion layer results in reduced collector-base capacitance and increased collector reverse breakdown voltage.

The base resistance of the PNIP or NPIN transistor is very low. The base resistance depends primarily on (*a*) the thickness and resistivity of the base material, and (*b*) the contact resistance of the base terminal boundary. Since the base or N layer may be highly doped without affecting the depletion layer the base resistance, which depends inversely on the concentration of this N doping, may be made much lower. Also there may be used a ring-base terminal to give a low base to base terminal contact resistance and consequently a low base resistance. The high frequency response is improved due to the use of the thin base of low resistivity. In addition the PNIP transistor is useful as a rugged transistor unit since the thin base layer is supported by the thick intrinsic layer.

The disadvantages of the PNIP transistor described above are twofold. Firstly, at high frequencies with reduced collector-base capacitance, the emitter-base capacitance becomes a limiting factor in the performance by providing a low impedance shunt around the emitter-base junction. Secondly, the base or N layer does not have either a predetermined thickness or end faces which are either plane or parallel.

Since the emitter alloying thickness 19 is not precisely controllable or predetermined the resultant effective base thickness 27 which is merely the width of the original N-type base 13 minus the emitter alloying thickness 19 is not precisely predetermined. Since the alloying thickness 19 is not precisely predetermined in general the alloying thickness 19 will be different at different points along the length of the base. Thus the end face of the base layer, which is the PN boundary layer, remains neither plane nor parallel to the opposite end face of the base leaving an effective base layer which has neither plane nor parallel faces. An etching technique may be used to reduce this effect at the outer edges of the emitter but again the etching process is difficult to control.

Figure 2:
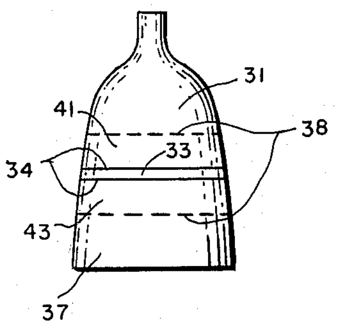
Fig. 2 is a view of a INI blank or ingot used in the fabrication of the improved transistor.

One method of fabrication of a transistor in accordance with the principles of this invention is as follows:

Referring to Fig. 2, a crystal 31 of the pure intrinsic or I-type may be drawn by the Czochralski pulling process (J. Czochralski, Z. Physik Chem., vol 92, p. 219 (1918)). During this process impurities are added. Firstly, N-type impurities are added to form an N-type conductivity layer 33 adjacent to the original pure I region 31. Subsequently, just enough P-type impurities are added to compensate for the remaining N-type impurities producing a second intrinsic, I-type, layer 37 adjacent to the N-type layer. It is well known in the art that the resultant N-type layer 33 will have end faces 34 which are both plane and parallel to one another. An INI wafer is sliced, as indicated by the dotted lines 38, from the finished ingot of Fig. 2 to form an INI blank. Referring to Figs. 3 and 4, this INI blank is composed of an N-type wafer having I-type skins on both faces. The wafer is etched for cleaning, using a suitable fluid such as $HF-HNO_3$ etch. A P-type emitter 45 and a P-type collector 47 are added independently by suitable means, such as an indium-germanium fusing process, to the two I-type skins 41 and 43. A loop-base terminal 49 formed of N-type material is connected to the N-type base 33 by suitable means such as soldering so that it extends longitudinally for a considerable distance on the outside surface of the base 33. A typical base lead might contain 60% tin, 35% lead and 5% antimony where the antimony is N-type dope. This loop-base terminal 49 may overlap and connect to either or both of the adjacent intrinsic layers 41 and 43 without detrimental effect as in the conventional PNP semi-conductor (see U. S. Patent No. 2,654,059 issued to W. Shockley). An emitter terminal 51 and a collector terminal 53 are attached respectively by suitable means to the emitter P-type layer 45 and collector P-type layer 47.

It will be apparent that a transistor constructed as described above posses the following advantages. It has a range of operating frequencies extending higher than that of previous transistors. It has a relatively large power handling capacity. These two features are achieved through lowered emitter capacitance and improved base layer geometry. Lowered emitter capacitance results from the coaction of the emitter layer 45 with an adjacent intrinsic layer 41 which acts as a relatively thick depletion layer.

In the previous transistors, such as the above described PNIP transistor, the base has a thickness which cannot be predetermined or controlled and end faces which are neither plane nor parallel. In this improved transistor, due to the insertion of the intrinsic layer 41, the base 33 has a thickness which is predetermined and end faces 34 which are plane and parallel to one another.

What is claimed is:

1. An improved transistor comprising a base of one conductivity type, an emitter of the opposite conductivity type, a collector of the opposite conductivity type, an intrinsic layer connecting said base to said emitter and an intrinsic layer connecting said base to said collector to form a transistor having a base whose thickness is predetermined and whose end faces are plane and parallel to one another.

2. An improved transistor comprising a base of one conductivity type, an emitter of the opposite conductivity type, a collector of the opposite conductivity type, an intrinsic conductivity type layer connecting said base to said emitter, an intrinsic conductivity type layer connecting said base to said collector, a loop-base terminal of the one conductivity type connected to said base and said layers for a considerable distance on the outside surface of said base, means for making an electrical connection to said emitter and means for making an electrical connection to said collector to form a transistor having a base whose thickness is predetermined and whose end faces are plane and parallel to one another.

3. An improved transistor comprising a base of one conductivity type, an intrinsic conductivity type layer connected to one end face of said base, an intrinsic conductivity type layer connected to the other end face of said base and layers of an opposite conductivity type connected to said intrinsic layers to form a transistor having a base whose thickness is predetermined and whose end faces are plane and parallel to one another.

4. An improved transistor comprising a base of one conductivity type, an intrinsic conductivity type layer connected to one end face of said base, an intrinsic type layer connected to the other end face of said base, an emitter connected to one of said intrinsic layers, a collector connected to the other of said intrinsic layers, said emitter and said collector being of opposite type conductivity to that of said base, a loop-base terminal of the one conductivity type connected to said base and said intrinsic conductivity type layers over a considerable portion of the outside surface of said base and layers to form a transistor having a base whose thickness is predetermined and whose end faces are plane and parallel to one another.

5. An improved transistor comprising a base of one conductivity type, an intrinsic conductivity type skin on one end face of said base, an intrinsic conductivity type skin on the other end face of said base, layers of a conductivity type opposite to that of said base connected to said intrinsic conductivity type skins, a loop-base terminal of the base conductivity type connected to said base and said skins for a considerable distance on the outside surface of said base, means for making an electrical connection for an input signal and means for making an electrical connection for an output signal to form a transistor having a base whose thickness is predetermined and whose end faces are plane and parallel to one another.

6. An improved transistor comprising a base of the N conductivity type, an intrinsic conductivity type skin covering one end face of said base, an intrinsic type conductivity skin covering the other end face of said base, a P conductivity type emitter in electrical contact with one of said intrinsic type skins, a P conductivity type collector in electrical contact with the other of said intrinsic type skins, a loop-base terminal of the N conductivity type connected to the N conductivity type base for a considerable distance on the outside surface of said base so that said loop-base terminal may overlap and connect to said skins, an electrical terminal connected to said emitter and an electrical terminal connected to said collector to form a transistor having a base whose thickness is predetermined and whose end faces are plane and parallel to one another.

7. An improved transistor comprising a base of P conductivity type, an intrinsic conductivity type layer connected to one end face of said base, an intrinsic conductivity type layer connected to the other end face of said base, an emitter of the N conductivity type connected to one of said intrinsic conductivity type layers, a collector of the N conductivity type connected to the other of said intrinsic conductivity type layers, and a loop-base terminal of the P conductivity type connected to the P conductivity type base and to the intrinsic conductivity type layers over a considerable distance on the outside surface of said base to form a transistor whose base has a predetermined thickness and whose end faces are plane and parallel to one another.

References Cited in the file of this patent

UNITED STATES PATENTS

| | | |
|---|---|---|
| 2,697,052 | Dacey et al. | Dec. 14, 1954 |
| 2,735,049 | De Forest | Feb. 14, 1956 |